(12) United States Patent
Yu

(10) Patent No.: US 7,588,987 B2
(45) Date of Patent: Sep. 15, 2009

(54) SEMICONDUCTOR DEVICE AND METHOD FOR FABRICATING THE SAME

(75) Inventor: Ji Hwan Yu, Gwangiu (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 534 days.

(21) Appl. No.: 11/319,572

(22) Filed: Dec. 29, 2005

(65) Prior Publication Data

US 2006/0145289 A1 Jul. 6, 2006

(30) Foreign Application Priority Data

Dec. 30, 2004 (KR) .................. 10-2004-0116552

(51) Int. Cl.
*H01L 21/8236* (2006.01)
*H01L 31/062* (2006.01)
(52) U.S. Cl. ...................... 438/278; 257/390
(58) Field of Classification Search .......... 438/778, 438/174, 290, 276–278; 257/640, 199, 390
See application file for complete search history.

(56) References Cited

U.S. PATENT DOCUMENTS

| 5,453,635 | A | * | 9/1995 | Hsu et al. | 257/336 |
| 6,046,494 | A | * | 4/2000 | Brigham et al. | 257/640 |
| 6,939,814 | B2 | * | 9/2005 | Chan et al. | 438/778 |
| 7,214,629 | B1 | * | 5/2007 | Luo et al. | 438/778 |
| 2004/0104405 | A1 | * | 6/2004 | Huang et al. | 257/199 |

* cited by examiner

*Primary Examiner*—Calvin Lee
(74) *Attorney, Agent, or Firm*—McKenna Long & Aldridge LLP

(57) ABSTRACT

A semiconductor device and a method for fabricating the same selectively forms a nitride layer having high tensile stress in an NMOS transistor area, to thereby form a strained-silicon structure in an NMOS channel region, whereby electron mobility is improved and drain current is increased. The semiconductor device includes an isolation region that, electrically isolates an N-type MOS transistor area from a P-type MOS transistor area, and a nitrade layer formed on an entire upper surface of a substrate, wherein the nitrade layer has silicon ions ($Si^+$) selectively implanted in the P-type MOS transistor area.

11 Claims, 2 Drawing Sheets

SEMICONDUCTOR DEVICE AND METHOD FOR FABRICATING THE SAME

This application claims the benefit of Korean Patent Application No. 10-2004-0116552, filed on Dec. 30, 2004, which is hereby incorporated by reference for all purposes as if fully set forth herein.

BACKGROUND OF THE INVENTION

1. Field of the Invention

The present invention relates to semiconductor devices, and more particularly, to a semiconductor device and a method for fabricating the same, which prevents a decrease in the drain current of a metal-oxide-silicon transistor that is subject to short channel effects.

2. Discussion of the Related Art

A highly integrated semiconductor device includes a multitude of transistors formed on a semiconductor substrate, each having a finite channel length. Short channel effects, which destroy normal transistor operation as an electrical field is rapidly developed and applied to a channel region, are increasingly prevalent in more highly integrated semiconductor devices, which inherently have shorter channel lengths.

To prevent such deterioration of transistor characteristics, short channels effects should be minimized. Minimizing short channel effects may be achieved by performing an additional ion implantation step when forming a transistor having a lightly doped drain structure in which low-density source and drain regions are formed on either side of a gate before forming spacers on gate sidewalls. However, a decrease in the intensity of the electrical field, while minimizing the short channel effect, results in a rapid decrease in drain current.

SUMMARY OF THE INVENTION

Accordingly, the present invention is directed to a semiconductor device and a method for fabricating the same that substantially obviates one or more problems due to limitations and disadvantages of the related art.

An advantage of the present invention is to provide a semiconductor device and a method for fabricating the same, which prevents a decrease in the drain current of a metal-oxide-silicon transistor that is subject to short channel effects.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a semiconductor device includes an isolation region formed in a semiconductor substrate that electrically isolates an N-type MOS transistor area from a P-type MOS transistor area, and a nitride layer formed on an entire upper surface of the semiconductor substrate, wherein the nitride layer has silicon ions (Si$^+$) selectively implanted in the P-type MOS transistor area.

According to another aspect of the present invention, a semiconductor device includes an isolation region formed in a semiconductor substrate defining a plurality of active regions, a plurality of gates formed on the substrate of the plurality of active regions, a plurality of source/drain regions formed in the substrate corresponding to both sides of each of the plurality of gates, a silicide layer formed on an upper surface of each of the plurality of gates and the plurality of source/drain regions, and a nitride layer formed on an entire upper surface of the substrate.

According to another aspect of the present invention, a method for fabricating a semiconductor device includes forming an isolation region by etching a predetermined portion of a semiconductor substrate and filling the predetermined portion with an insulating material, forming a gate by patterning a gate oxide layer and a gate electrode layer on the semiconductor substrate, forming source/drain regions of a lightly doped drain structure at both sides of the gate by implanting impurity ions into the semiconductor substrate at a high density and at a low density, selectively forming a silicide layer on the gate and the source/drain regions, and forming a nitride layer on an entire upper surface of the semiconductor substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Figure 1A:
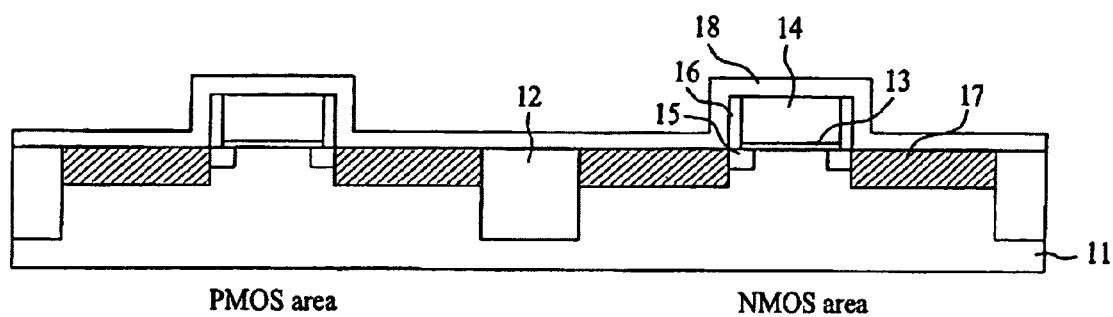
FIGS. 1A-1C are cross-sectional views of a semiconductor device fabricated according to the method of the present invention.
Figure 1B:
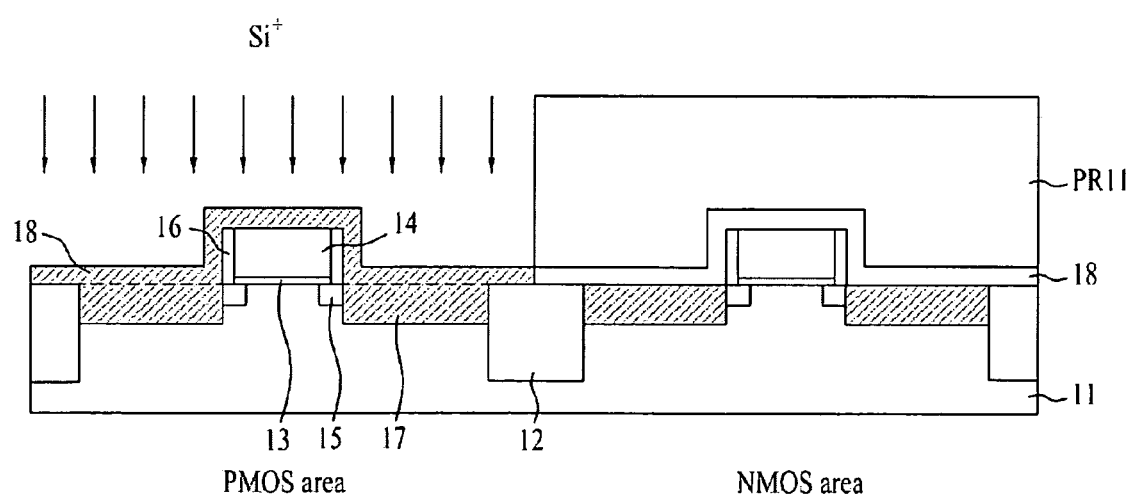
Figure 1C:
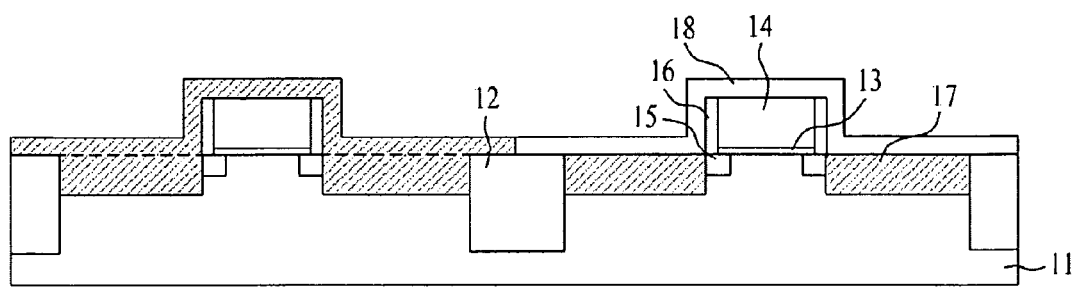

FIGS. 1A-1C cross-sectional views of a semiconductor device and respectively illustrate sequential steps of a method for fabricating a semiconductor device according to the present invention.

Referring to FIG. 1A, a predetermined portion of a semiconductor substrate 11 is etched to form a trench. The trench is filled with an insulating material to form an isolation region 12 defining an active region of a semiconductor device. The isolation region 12 is a shallow-trench isolation (STI) region generally applied to a highly integrated semiconductor device. The active area will include a P-type metal-oxide-silicon (PMOS) transistor to be formed in the PMOS area and an N-type metal-oxide-silicon (NMOS) transistor to be formed in the NMOS area. A gate oxide layer and a gate electrode layer are successively formed on an entire upper surface of the semiconductor substrate 11 including the isolation region 12 to cover both the PMOS and NMOS areas. The gate oxide and gate electrode layers are patterned to form a gate electrode structure comprising a gate oxide 13, disposed under a gate electrode 14 for each of a PMOS transistor and an NMOS transistor. Using the gate electrode structures as an ion implantation mask, impurity ions are implanted at a low density to form lightly doped source/drain regions 15 in a surface of the semiconductor substrate 11. Source/drain regions are thus disposed on either side of both gates, i.e., the respective gates of the PMOS and NMOS transistors. The impurities forming the source/drain regions of the two transistor types have opposite conductivities. Ions of a first conductivity form the source/drain regions of the PMOS transistor and ions of a second conductivity form the source/drain regions of the NMOS transistor. Separate successive ion implantation steps are performed. That is, an ion implantation step is first performed in either the PMOS area or NMOS area, and then another ion implantation step is performed in the other of the PMOS area or NMOS area. Spacers 16 are then formed on the sidewalls of the respective gates of the PMOS and NMOS transistors. The spacers 16 are used as an ion implantation mask when impurity ions are again implanted into the semiconductor substrate 11, but at a high density this time, to form heavily doped source/drain regions 17 adjacent the lightly doped source/drain regions 15. A silicide layer (not shown) is selectively formed on upper surfaces of the gates and source/drain regions of the PMOS and NMOS transistors, and a nitride layer 18 is formed to a thickness of approximately 1,000 to 3,000 Å by a thermal chemical vapor deposition over the entire resulting structure. Since the nitride layer 18 has a high tensile stress, a strained-silicon structure is formed in a channel region below the gate oxide layer 13.

Referring to FIG. 1B, a layer of photoresist is formed on the entire upper surface of the semiconductor substrate 11. The photoresist is treated with exposure and development to selectively remove the photoresist from the PMOS area, to thereby form a photoresist pattern PR11, which exposes the nitride layer 18 of the PMOS area where silicon ions ($Si^+$) may be implanted at energy of approximately 20 to 130 KeV to a concentration of approximately $1 \times 10^{14}$ to $1 \times 10^{15}$ ions/$cm^2$. This implantation enables a decrease in the tensile stress of the nitride layer 18 formed in the PMOS area. Since the stressed nitride layer remains in the NMOS area, the strained-silicon structure remains in the channel region of the NMOS transistor. Thus, a stressed nitride layer can be selectively formed in the NMOS area.

Referring to FIG. 1C, the photoresist pattern PR11 is removed from the NMOS area. Fabrication of the semiconductor device may be completed by general processing.

Accordingly, in the semiconductor device and the method for fabricating the same according to the present invention, since a nitride layer having a high tensile stress can be selectively formed in the NMOS area, the strained-silicon structure is formed in the channel region of the NMOS transistor. Thus, it is possible to improve electron mobility and enable higher drain currents in the NMOS transistor.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, comprising:
    forming an isolation region by etching a predetermined portion of a semiconductor substrate and filling the predetermined portion with an insulating material;
    forming a gate by patterning a gate oxide layer and a gate electrode layer on the semiconductor substrate for each of a PMOS transistor and an NMOS transistor;
    forming lightly doped source/drain regions at both sides of the gate by implanting impurity ions into the semiconductor substrate at a low density, wherein the implanting impurity ions for the PMOS transistor and the NMOS transistor have opposite conductivities;
    forming heavily doped source/drain regions by implanting impurity ions into the semiconductor substrate adjacent to the lightly doped source/drain regions at a high density;
    selectively forming a silicide layer on the gate and the source/drain regions; and
    forming a nitride layer on an entire upper surface of the semiconductor substrate.

2. The method of claim 1, further comprising:
    implanting silicon ions ($Si^+$) in the semiconductor substrate after forming the nitride layer on the entire upper surface of the semiconductor substrate.

3. The method of claim 2, wherein the silicon ions ($Si^+$) are implanted at an energy of approximately 20 to 130 KeV to a concentration of approximately $1 \times 10^{14}$ to $1 \times 10^{15}$ ions/$cm^2$.

4. A semiconductor device, comprising:
    an isolation region formed in a semiconductor substrate that electrically isolates an N-type MOS transistor area from a P-type MOS transistor area;
    a gate formed on the semiconductor substrate corresponding to each of the N-type MOS transistor area and the P-type MOS transistor area;
    lightly doped source/drain regions formed in the semiconductor substrate at both sides of the gate;
    heavily doped source/drain regions formed in the semiconductor substrate and adjacent to the lightly doped source/drain regions; and
    a nitride layer formed on an entire upper surface of the semiconductor substrate, wherein said nitride layer has silicon ions ($Si^+$) selectively implanted in the P-type MOS transistor area.

5. The semiconductor device of claim 4, wherein the N-type MOS transistor area has no silicon ions ($Si^+$) implanted.

6. The semiconductor device of claim 4, wherein said nitride layer of the N-type MOS transistor area has no silicon ions ($Si^+$) implanted.

7. The semiconductor device of claim 4, further comprising:
    a suicide layer formed on upper surfaces of the gate and the source/drain regions.

8. A semiconductor device, comprising:
    an isolation region formed in a semiconductor substrate defining a plurality of active regions;
    a plurality of gates formed on the substrate of the plurality of active regions;
    a plurality of lightly doped source/drain regions formed in the substrate corresponding to both sides of each of the plurality of gates;
    a plurality of heavily doped source/drain regions formed in the semiconductor substrate and adjacent to the lightly doped source/drain regions;
    a silicide layer formed on an upper surface of each of the plurality of gates and the plurality of source/drain regions; and
    a nitride layer formed on an entire upper surface of the substrate.

9. The semiconductor device of claim 8, wherein one of the plurality of gates and one of the plurality of the lightly doped and heavily doped source/drain regions constitutes an N-type MOS transistor formed in an N-type MOS transistor area.

10. The semiconductor device of claim 8, wherein one of the plurality of gates and one of the plurality of the lightly doped and heavily doped source/drain regions constitutes a P-type MOS transistor formed in a P-type MOS transistor area.

11. The semiconductor device of claim 10, wherein the nitride layer is formed by implanting silicon ions ($Si^+$) in the P-type MOS transistor area.

* * * * *